(12) United States Patent
Barbic

(10) Patent No.: US 6,897,654 B2
(45) Date of Patent: May 24, 2005

(54) SYSTEM AND METHOD OF MAGNETIC RESONANCE IMAGING

(75) Inventor: Mladen Barbic, South Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 10/411,769

(22) Filed: Apr. 11, 2003

(65) Prior Publication Data

US 2003/0193333 A1 Oct. 16, 2003

Related U.S. Application Data

(60) Provisional application No. 60/372,003, filed on Apr. 12, 2002.

(51) Int. Cl.[7] ............................................. G01V 3/00
(52) U.S. Cl. ....................................................... 324/307
(58) Field of Search ............................... 324/307, 309, 324/318, 319, 300

(56) References Cited

U.S. PATENT DOCUMENTS

| | | | | |
|---|---|---|---|---|
| 5,003,815 A | * | 4/1991 | Martin et al. ................. 73/105 |
| 5,126,671 A | | 6/1992 | Bodenhausen et al. ...... 324/309 |
| 5,166,615 A | * | 11/1992 | Sidles ......................... 324/307 |
| 5,266,896 A | * | 11/1993 | Rugar et al. ................. 324/307 |
| 5,585,722 A | * | 12/1996 | Hosoki et al. ............... 324/318 |
| 5,619,139 A | * | 4/1997 | Holczer et al. .............. 324/318 |
| 5,874,668 A | * | 2/1999 | Xu et al. ........................ 73/105 |
| 6,078,872 A | | 6/2000 | Carson et al. ............... 324/307 |
| 6,081,119 A | | 6/2000 | Carson et al. ............... 324/307 |
| 6,100,687 A | * | 8/2000 | Weitekamp et al. ......... 324/300 |
| 6,181,131 B1 | * | 1/2001 | Bruland et al. ............. 324/300 |
| 6,518,747 B2 | | 2/2003 | Sager et al. ................. 324/307 |
| 6,683,451 B1 | * | 1/2004 | Moore et al. ............... 324/218 |

OTHER PUBLICATIONS

Sidles et al, Magnetic Resonance Force Microscopy: Review of Modern Physics vol. 67(1) pp 249–265, 1995.*
Schimmel et al, Layer–byLayer Growth and Decomposition of an Organic Crystal Observed in Real Time by Atomic Force Microscopy. Advance Matter 6(4), pp 307–311, 1994.*
Hiller et al. Atomic Force Microscopy of the Electrochemical Nucleation and Growth of Molecular Crystals, Science, vol. 263, pp 1261–1264, 1994.*
"Magnetic Resonance Force Microscopy: A Detailed Summary", Apr. 2, 2003, http://micromachine.stanford.edu/smssl/projects/NovelMicrostructures/MRFMDetails.html, pp. 1–3.
"Magnetic Resonance Force Microscopy", Apr. 2, 2003, http://www.its.caltech.edu/~hammel/mrfmpch.html, pp. 1–4.

(Continued)

*Primary Examiner*—Brij B. Shrivastav
(74) *Attorney, Agent, or Firm*—Greer, Burns & Crain, Ltd.

(57) ABSTRACT

A method of imaging a sample. A magnetic particle is positioned near a sample to be imaged. A strong direct current (DC) magnetic field is applied in a non-perpendicular direction relative to the sample, and a relatively weaker radio frequency (RF) magnetic field is applied. A plurality of polarized magnetic spins of the sample is produced in a region near the magnetic particle, and resonance of the plurality of magnetic spins is detected. The detected plurality of magnetic spins can be used to provide an image of the sample.

18 Claims, 8 Drawing Sheets

OTHER PUBLICATIONS

Barbic, "Magnetic resonance diffraction using the magnetic field from a ferromagnetic sphere", Journal of Applied Physics, vol. 91 (12), pp. 9987–9994 (2002).

Barbic, abstract, http://www.immerge.com/aspfolder/ProcessENC2002.asp, Dec. 26, 2001.

Berman et al., "Modified approach to single–spin detection using magnetic resonance force microscopy", Phys. Rev. B, vol. 61, No. 5, pp. 3524 (2000).

Berman et al., "Magnetic Resonance Force Microscopy Quantum Computer with Tellurium Donors in Silicon", Phys. Rev. Letters, vol. 86, No. 13, pp. 2894–2896 (2001).

Berman et al., "Stationary cantilever vibrations in oscillating–cantilever–driven adiabatic reversals: Magnetic–resonance–force microscopy technique", Phys. Rev. A 66 (2002).

Berman et al., "Magnetic–resonance force microscopy measurement of entangled spin states", Phys. Rev. A 66 (2002).

Berman et al., "Single–spin measurement and decoherence in magnetic–resonance force microscopy", Phys. Rev. B 67 (2003).

Bruland et al., "Force–detected magnetic resonance in a field gradient of 250 000 Tesla per meter", Appl. Phys. Lett. 73, pp. 3159–3161 (1998).

Goldman et al., "Magnet designs for crystal–lattice quantum computer", Appl. Phys. A 71, pp. 11–17 (2000).

Hammel et al., "The Magnetic–Resonance Force Microscope: A New Tool for High–Resolution, 3–D, Subsurface Scanned Probe Imaging", Proceedings of the IEEE, vol. 91, No. 5 (2003).

Hannay et al., "Thermal field fluctuations in a magnetic tip/implications for magnetic resonance force microscopy", J. Appl. Phys. vol. 87, No. 9, pp. 6827–6829 (2000).

Kempf et al., "Nanoscale Fourier–Transform Imaging with Magnetic Resonance Force Microscopy", Phys. Rev. Letters, vol. 90, No. 8, (2003).

Mamin et al., "Sub–attonewton force detection at mililikelvin temperatures", Appl. Phys. Lett. vol. 79, No. 20, pp. 3358–3360 (2001).

Mamin et al., "Superconducting microwave resonator for mililikelvin magnetic resonance force microscopy", Review of Scientific Instruments, vol. 74, No. 5, pp. 2749–2753 (2003).

Mansfield et al., "Diffraction and microscopy in solids and liquids by NMR", Phys. Rev. B, vol. 12, No. 9, pp. 3618–3634 (1975).

Midzor et al., "Imaging mechanisms of force detectied FMR microscopy", Journal of Applied Physics, vol. 87, No. 9, pp. 6493–6495 (2000).

Mozyrsky et al., "Theory of spin relaxation in magnetic resonance force microscopy", Applied Physics Letters, vol. 82, No. 8, pp. 1278–1280 (2003).

Rugar et al., "Force Detection of Nuclear Magnetic Resonance", Science, vol. 264, pp. 1560–1563 (1994).

Rugar et al., "Improved fiber–optic interferometer for atomic force microscopy", Appl. Phys. Lett. 55, pp. 2588–2590 (1989).

Sidles et al., "Signal–To–Noise Ratios in Inductive and Mechanical Detection of Magnetic Resonance", Phys. Rev. Lett., vol. 70, No. 22, pp. 3506–3509 (1993).

Sidles et al., "Magnetic resonance force microscopy", RMP Colloquia, Rev. Mod. Phys., vol. 67, No. 1, pp. 249–265 (1995).

Sidles, "Noninductive detection of single–proton magnetic resonance", Appl. Phys. Lett. 58, pp. 2854–2856 (19910.

Stipe et al., "Magnetic Dissipation and Fluctuations in Individual Nanomagnets Meausred by Ultrasensitive Cantilever Magnetometry", Phys. Rev. Lett., vol. 86, No. 13, pp. 2874–2877 (2001).

Stipe et al., "Electron Spin Relaxation Near a Micron–Size Ferromagnet", Phys. Rev. Lett., vol. 87, No. 27 (2001).

Stowe et al., "Attonewton force detecting using ultrathin silicon cantilevers", Appl. Phys. Lett. 71, pp. 288–290 (1997).

Suh et al., "Ferromagnetic resonance imaging of Co films using magnetic resonance force microscopy", J. Vac. Sci. Technol. B 16(4), pp. 2275–2279 (1998).

Verhagen et al., "Mechanical detection of NMR, Advantages of a digital approach", Phys. Chem. Chem. Phys., pp. 4025–4031 (1999).

Verhagen et al., "Spatially Resolved Spectroscopy and Structurally Encoded Imaging by Magnetic Resonance Force Microscopy of Quadrupolar Spin Systems", J. Am. Chem. Soc., vol. 124, No. 8 pp. 1588–1589 (2002).

Wago et al., "Paramagnetic and ferromagnetic resonance imaging with a tip–on–cantilever magnetic resonance force microscope", Applied Physics Letters, vol. 72, No. 21, pp. 2757–2759 (1998).

Yamaguchi et al., "Crystal lattice quantum computer", Appl. Phys. A 68, pp. 1–8 (1999).

Zhang et al., "Ferromagnetic resonance force microscopy on microscopic cobalt single layer films", Applied Physics Letters, vol. 73, No. 14, pp. 2036–2038 (1998).

Zhang et al., "Observation of ferromagnetic resource in a microscopic sample using magnetic resonance force microscopy", Appl. Phys. Lett. 68 (14), pp. 2005–2007 (1996).

Zhang et al., "High–sensitivity ferromagnetic resonance measurements on micrometer–sized samples", Appl. Phys. Lett. 70, pp. 2756–2758 (1997).

Zuger et al., "First images from a magnetic resonance force miccrscope", Appl. Phys. Lett. 63, pp. 2496–2498 (1993).

Zuger et al., "Three–dimensional imaging with a nuclear magnetic resonance force microscope", J. Appl. Phys. 79, pp. 1881–1884 (1996).

* cited by examiner

Magnetic Field (Gauss)

US 6,897,654 B2

SYSTEM AND METHOD OF MAGNETIC RESONANCE IMAGING

PRIORITY CLAIM

This application claims priority of U.S. Provisional Patent Application Ser. No. 60/372,003, filed Apr. 12, 2002, under 35 U.S.C. § 119.

STATEMENT OF GOVERNMENT INTEREST

This invention was made with Government assistance under National Science Foundation Grant No. NSF-DMR 97-24535. The Government has certain rights in this invention.

FIELD OF THE INVENTION

The present invention relates generally to the field of magnetic resonance imaging.

BACKGROUND OF THE INVENTION

Conventional magnetic resonance imaging has spatial imaging resolution of about 1 $\mu$m. Motivated by the potential of combining 3D imaging capability of conventional magnetic resonance and the atomic resolution of scanning probe techniques that utilize mechanical cantilevers, a new atomic resolution 3D magnetic resonance imaging technique was introduced. This method, magnetic resonance force microscopy (MRFM), uses a microscopic magnetic particle as a source of atomic scale imaging gradient fields and a mechanical resonator as a sensitive detector of magnetic resonance, as opposed to more conventional inductive techniques. Proof-of-concept demonstrations of MRFM were carried out for various magnetic resonance systems including electron spin resonance, nuclear magnetic resonance, and ferromagnetic resonance.

However, while MRFM is rapidly progressing by the incorporation of smaller magnetic particles and more sensitive mechanical resonators, current MRFM imaging resolution of ~1 $\mu$m remains at the level of conventional MRI inductive detection. A single nuclear or electron spin has not been successfully detected yet due to significant technical challenges.

Additionally, while achieving single spin sensitivity and resolution in a 3D imaging technique is of great significance, the MRFM technique also places challenging demands on the technical requirements, such as operation at very low temperatures, miniaturization of mechanical cantilevers, and the integration of magnetic nanoparticles into resonating structures.

SUMMARY OF THE INVENTION

The present invention provides a method of imaging a sample. In a preferred embodiment of the method, a magnetic particle is positioned near a sample to be imaged. A strong direct current (DC) magnetic field is applied to polarize the sample, and a relatively weaker radio frequency (RF) magnetic field is applied. Preferably, the direct current (DC) magnetic field is applied in a non-perpendicular direction to a surface of the sample. The DC field and/or RF frequency may be tuned to obtain resonance of the sample.

A plurality of polarized magnetic spins of the sample is produced, and a magnetic resonance of the plurality of magnetic spins in a region near the magnetic particle is detected. The detected plurality of magnetic spins can be used to provide an image of the sample.

DETAILED DESCRIPTION OF THE INVENTION

Figure 1:
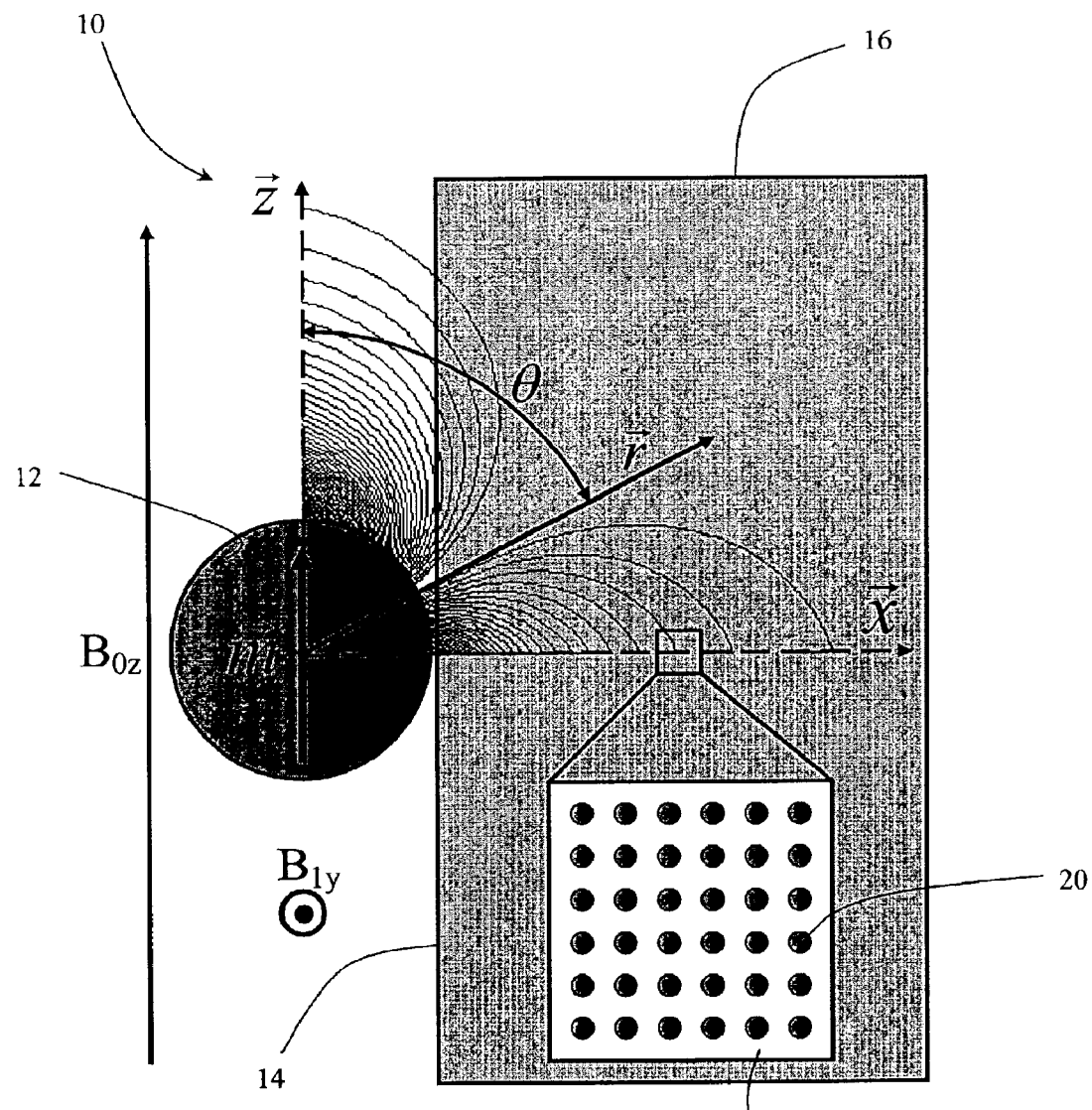
FIG. 1 is a schematic view of a model configuration for magnetic resonance imaging according to a preferred method of the present invention.

The present invention provides a novel method of magnetic resonance imaging. According to the present method of imaging a sample, a magnetic resonance absorption signal is detected using the field from a magnetic particle. The absorption signal has features that are the direct signature of the atomic structure of the sample. Because different sample crystal structures have different spectral features, the technique can be used to study the crystal structure, for example, and chemical environment of the sample by magnetic resonance at the atomic level. The technique can be used in imaging of, as non-limiting examples, large crystals, thin films, or small crystallites. Other, non-crystalline materials are contemplated for imaging, as well.

The present invention provides a method of imaging using magnetic resonance for imaging a sample in close proximity of a magnetic particle, such as a sphere. A preferred embodiment of the invention includes positioning a small magnetic particle in close vicinity of a sample surface, and applying a large polarizing field and a small radio-frequency field in a specific configuration so that absorption spectra reveals the crystal structure of the sample of interest. More particularly, a magnetic resonance signal is produced due to the presence of the magnetic particle, having a spectrum (or spectra) with sharp spectral peaks dependent on specific magnetic particle and magnetic field configurations. The appearance of the peaks is a direct signature of discrete atomic sites in the crystal lattice. The detection of these peaks may be used for atomic scale magnetic resonance. The positions of the spectral peaks are sensitive to the unit cell size of the sample, thereby providing a method for determination of the basic parameters of the sample at the atomic scale. The magnetic resonance spectra are dependent on the particle size and the angle of the particle magnetization with respect to the sample surface.

Although the method detects many nuclear or electronic spins at the same time, the present magnetic resonance technique allows sharp spectral features to appear that are a direct signature of the atomic structure. This is a significant distinction from other magnetic resonance techniques that seek to detect single spins, since one can determine the crystal structure even by detecting magnetic resonance from thousands of nuclear or electronic spins.

Using a preferred embodiment of the present method, the technical challenges of detecting magnetic resonance are reduced, due to the larger signal that can be obtained from many spins, but one can still obtain a magnetic resonance signal that reveals the atomic structure. The present method differs from, for example, the conventional MRFM method currently pursued for achieving single spin sensitivity and resolution by, among other things, employing an approach that relaxes the sensitivity requirements vis-à-vis MRFM by allowing many spins to coherently contribute to the magnetic resonance signal while still providing atomic scale information.

The preferred imaging method of the present invention has potential applications to the studies of, as non-limiting examples, crystals, thin films, and crystallites. Potential measurement methods for the confirmation of this imaging theory are also disclosed.

Referring now to the drawings, FIG. 1 shows the basic model configuration of an imaging device 10 embodying a preferred method of the present invention. A magnetic particle 12 is positioned in proximity, for example, between zero (contact) to on the order of hundreds of nanometers, of a surface 14 of a sample 16, preferably positioned via a mechanical positioner, for example, but not necessarily, a support such as a cantilevered or other support (not shown). The sample 16 may be, for example, a simple cubic lattice crystal. The magnetic particle 12 may be a sphere or other shape, such as, but not limited to, a pyramidal tip, conical tip, elongated ellipsoid, etc., and may have a size between, for example, on the order of tens of nanometers to several microns. Materials for the magnetic particle 12 may include, as non-limiting examples, Cobalt, Nickel, and Iron. Those in the art will appreciate that many other materials may be used. The sample 16 may vary in size, for example, between small crystallites and semi-infinite crystals.

In the exemplary method shown in FIG. 1, the magnetic particle 12 is a sphere 100 nm in diameter and made of Cobalt with a magnetization per unit volume of 1500 emu/cm$^3$. The exemplary sample 16 is a crystal, and is assumed to have a unit cell size of $a_0$=3 Angstroms. A large (as a non-limiting example, between 1 and 20 Tesla, but any sufficient magnetic field to cause polarization) direct current (DC) magnetic field $B_0$ is applied in a first direction that is non-perpendicular (for example, as shown in FIG. 1, parallel) relative to the surface 14 of the sample 16. The magnetic field $B_0$ polarizes spins 20 of the atomic lattice 22 (a portion shown in enlarged view in FIG. 1) of the sample 16 for magnetic resonance investigation, and saturates the magnetization of the magnetic sphere 12. As shown in FIG. 1, and by convention, though not required, the magnetic field $B_0$ is assumed to be in the z-direction.

For magnetic resonance investigation, a radio frequency (RF) field $B_1$ having intensity significantly smaller than that of the DC magnetic field $B_0$, is applied in a second direction, preferably perpendicular to the large polarizing DC magnetic field. The DC magnetic field $B_0$ may be, as a non-limiting example, between 100 and 1 million times the intensity of the RF field $B_1$. In the example shown in FIG. 1, the RF field $B_1$ is applied in the y-direction. The RF field $B_1$ is a magnetic field that may be applied to the sample 16 by a suitable device such as an inductive coil (not shown), micro-stripline, or other suitable devices.

In the absence of the magnetic sphere 12, the atomic spin sites in the sample 16 would experience the same externally applied field $B_0$ and therefore meet the magnetic resonance condition at the same magnetic resonance frequency $\omega_R$. However, close to (i.e. in a region of) the magnetic particle, a large magnetic field gradient is present within the sample 16, for example, within a range on the order of 0.001–1000 Gauss/Angstrom, and only certain spin sites of the lattice of the sample satisfy the correct magnetic resonance conditions at any given magnetic field and frequency and therefore contribute to the magnetic resonance signal.

The magnetic field from the magnetic sphere 12 at a point r in the sample 16 has the azimuthally symmetric dipolar form:

$$\vec{B}(\vec{r}) = \frac{3\vec{n}(\vec{m}\cdot\vec{n}) - \vec{m}}{|\vec{r}|^3} \quad (1)$$

where n is the unit vector that points from the center of the magnetic sphere 12 to the crystal site location, and m is the magnetic moment vector of the sphere. Since the external DC polarizing magnetic field $B_0$ is considered to be much larger than the field from the magnetic sphere 12, for example by ~10 Tesla, only the z-component of the magnetic field $B_0$ is included in considering the resonant spins 20 of the atomic lattice 22 of the sample 16:

$$B_Z(\vec{r}) = \frac{M_0}{|\vec{r}|^3}(3\cos^2\theta - 1) \quad (2)$$

where $\theta$ is the angle between the z-axis (shown in FIG. 1) and the distance vector r as shown by example in FIG. 1, and $M_0$ is the magnitude of the saturation magnetic moment of the magnetic sphere 12. The contours of constant field $B_Z$ are also shown in FIG. 1, and they have the azimuthally symmetric form around the z-axis.

If the magnetic sphere 12 is sufficiently small that the magnetic fields vary strongly on the atomic scale, steps are taken to account for the discrete nature of the crystal lattice. Labeling the atomic sites with indices (m, n, l), and assuming a unit cell size with dimension $a_0$, the components in expression (2) take the form:

$$\cos^2\theta = \frac{z^2}{r^2} = \frac{z^2}{x^2+y^2+z^2} = \frac{(la_0)^2}{(ma_0)^2+(na_0)^2+(la_0)^2} = \frac{l^2}{m^2+n^2+l^2} \quad (3)$$

$$|\vec{r}|^3 = (x^2+y^2+z^2)^{3/2} = [(ma_0)^2+(na_0)^2+(la_0)^2]^{3/2} = a_0^3(m^2+n^2+l^2)^{3/2} \quad (4)$$

Incorporating equations (3) and (4) into equation (2), a final expression is derived for the z-component of the magnetic field $B_Z$ from a magnetic sphere 12 at the atomic site with index (m, n, l):

$$B_Z(m, n, l) = \frac{M_0(2l^2 - m^2 - n^2)}{a_0^3(m^2 + n^2 + l^2)^{5/2}} \quad (5)$$

$$m = \{167, 168, \ldots, +\infty\}$$

$$n = \{-\infty, \ldots, -1, 0, +1, \ldots, +\infty\}$$

$$l = \{-\infty, \ldots, -1, 0, +1, \ldots, +\infty\}$$

In this example, the index range for the x-axis starts with the integer 167, since expression (5) was derived for the 50 nm radius magnetic sphere 12 (166.66 times the lattice parameter $a_0=3$ Angstroms) at the center of the coordinate system. Those in the art will appreciate that these values can vary as the size, shape, and/or magnetization of the magnetic particle 12 vary, or for the sample 16, as the unit cell size, angle, or crystal structure vary, for example.

Figure 2A:
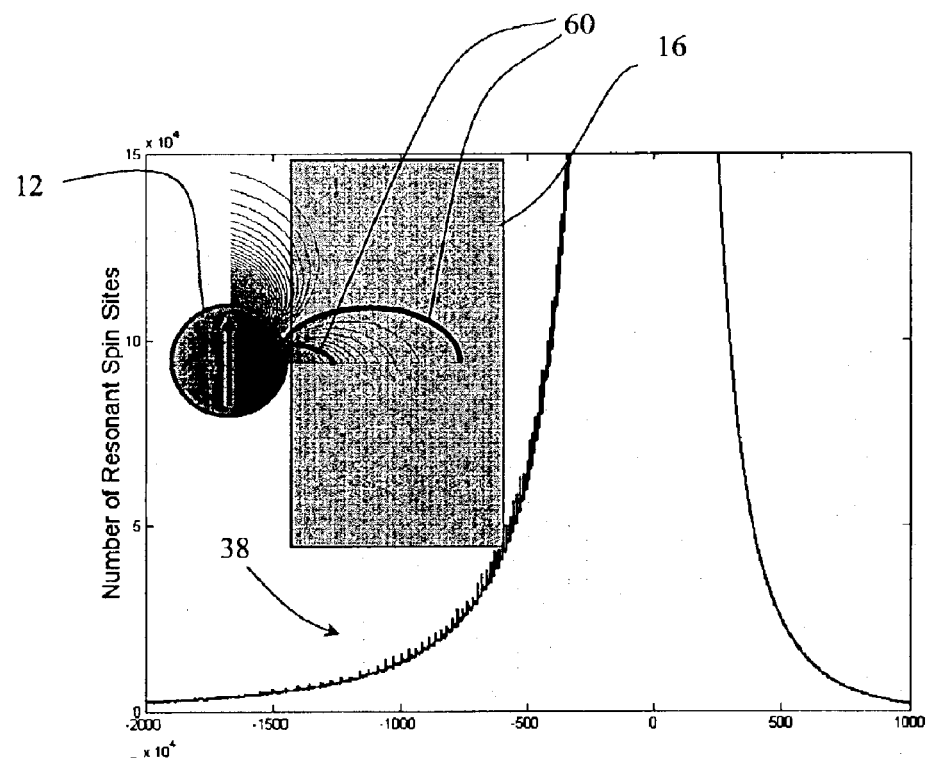
FIG. 2A is a histogram of the number of resonant spin sites of a 3 Angstrom unit cell size simple cubic crystal in the presence of a 100 nm diameter Cobalt ferromagnetic sphere, with an inset showing a model configuration with enhanced contours of constant $B_Z$.
Figure 2B:
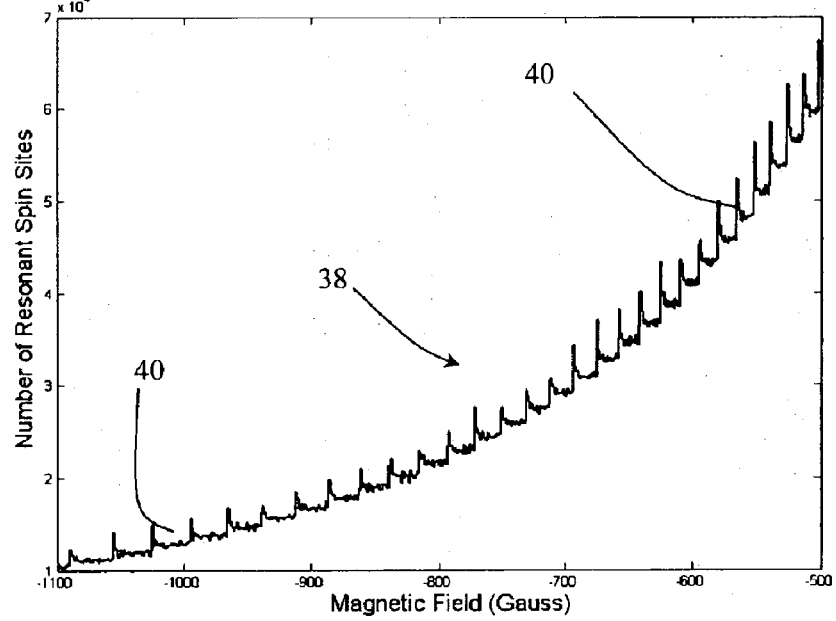
FIG. 2B is an enlarged view of a portion of the histogram of FIG. 2A.

A prediction is made from the model when numerical summation is computed for the histogram of the number of resonant spin sites within a thin 1-Gauss wide shell of constant $B_Z$, as shown in FIG. 2A. This value of the bin width is selected since the line width broadening in solids is of the order of 1 Gauss. The bin width can be varied, for example using pulse techniques, to increase the resolution. The DC field is tuned swept over a certain range, preferably while the RF frequency is held constant, and/or the DC field is held constant preferably while the RF frequency is tuned (swept) or pulsed, to produce the spectrum. In the field range of the DC magnetic field $B_0$, for example between approximately $B_{0Z}$-1800 Gauss to $B_{0Z}$-200 Gauss as shown in FIG. 2A, sharp peaks 40 occur in spectrum 38 (the histogram of the number of resonant spin sites), while there are no distinguishable features in the positive magnetic field range. A magnified view of the spectrum 38 region between $B_{0Z}$-1100 Gauss to $B_{0Z}$-500 Gauss is shown in FIG. 2B.

The present inventor has discovered that at certain values for the magnetic field $B_0$ there are significantly (as shown, approximately 10–20%, at least) more resonant spin sites than for the adjacent magnetic field values, i.e. field values greater than or less than the particular values where the peaks occur. The present inventor further concluded that the appearance of the sharp magnetic resonance spectral peaks 40 is the direct signature of the discrete atomic lattice sites of the sample 16. The spectrum 38 represents the image of the crystal lattice planes for the z-direction. By contrast, magnetic resonance of a continuous medium would result in a monotonic spectrum on the positive and negative values of the magnetic field $B_0$.

Figure 3:
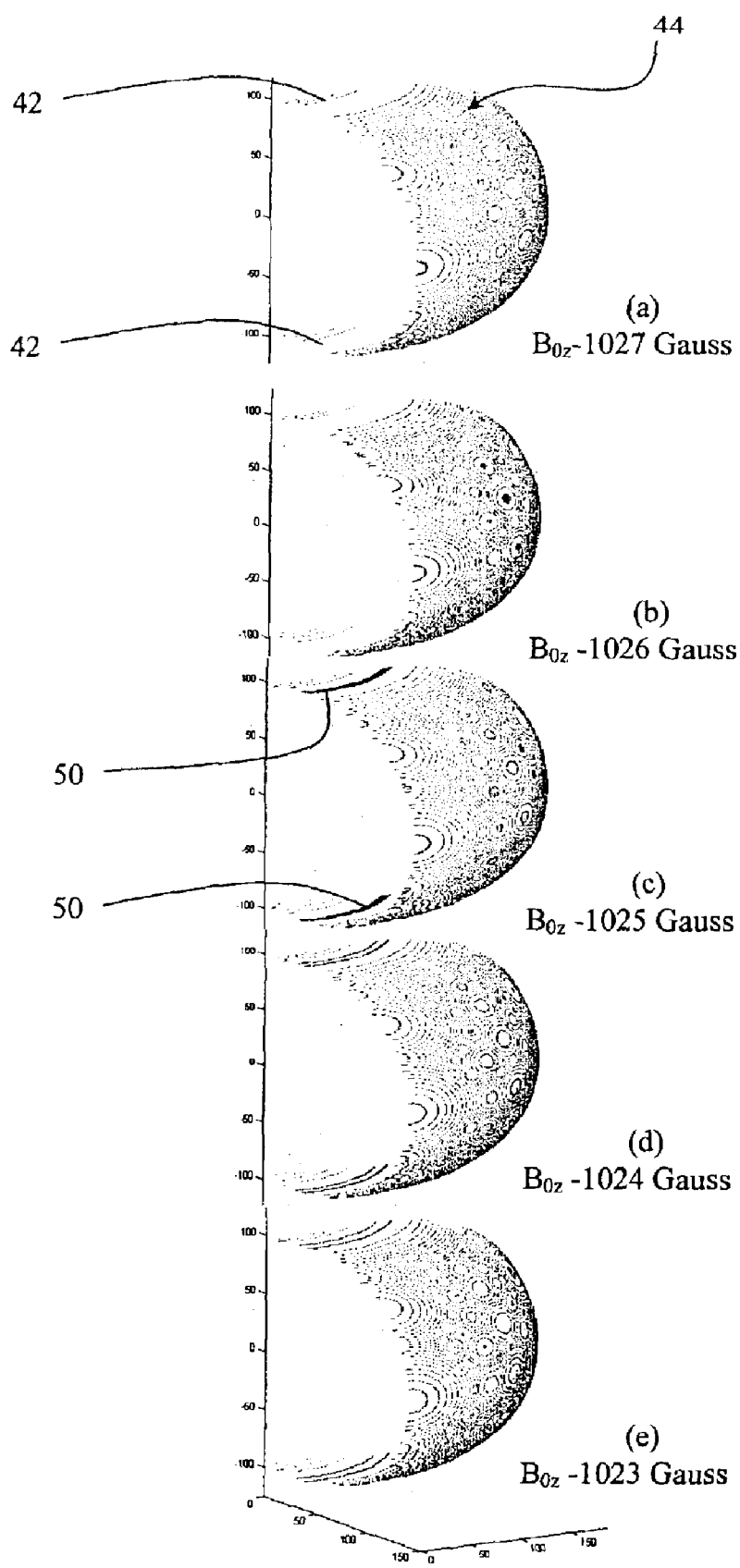
FIG. 3 is a set of three-dimensional visualization plots of simultaneously resonant spin sites of a crystal lattice, for DC magnetic field values (shells of constant $B_Z$) of $B_{Z0}$-1027, $B_{Z0}$-1026, $B_{Z0}$-1025, $B_{Z0}$-1024, and $B_{Z0}$-1023 Gauss, respectively.

A clear explanation for the appearance of the sharp magnetic resonance spectral peaks 40 emerges when one visualizes the resonant spins under the influence of the magnetic field from the exemplary magnetic sphere 12 in three dimensions. FIG. 3 shows five representation plots for crystal lattice spin sites of the sample 16 that are in resonance at a sequence of five values for the magnetic field $B_0$. Only the positive values for the y-axis indices are plotted for clarity. The magnetic field bin size is 1 Gauss, and the sequence is centered at the magnetic field value of $B_{0Z}$-1025 Gauss (shell (c)) the location of one of the sharp resonant peaks 40 in the spectrum 38 of FIG. 2. At the two higher magnetic field values of $B_{0Z}$-1027 Gauss and $B_{0Z}$-1026 Gauss (shells (a) and (b), respectively), there are two empty regions 42 at top and bottom sections 44 of the 1-Gauss thin shell of constant $B_Z$ where no atomic spin sites are intersected. The reason is that at these magnetic field values, the top and bottom sections of the shell of constant $B_Z$ from the magnetic sphere 12 are between the two lattice planes of the sample 16, and do not intersect the atomic layers. However, there are still many atoms of the crystal that satisfy the resonance condition, as shown in shells (a) and (b), and they form the background signal in the magnetic resonance spectra of FIG. 2.

At the field value of $B_{0Z}$-1025 Gauss (shell (c)) for the DC field $B_0$ the shell of constant $B_Z$ intersects the crystal lattice of the sample 16, so that a large number of spin sites from the two lattice planes at the top and bottom sections of the resonant shell satisfy the resonance condition. Two bands 50 of the resonant atoms from the lattice planes are clearly visible in FIG. 3, and these are the resonant rings that are responsible for the sharp peaks in the magnetic resonance spectrum. At the next lower values of the magnetic field, $B_{0Z}$-1024 Gauss and $B_{0Z}$-1023 Gauss (shells (d) and (e), respectively), the bands 50 of resonant spin sites from the lattice planes slowly disappear as the top and bottom sections of the resonant shell of constant $B_Z$ move between the next two adjacent atomic lattice planes. The inset diagram shown in FIG. 2A indicates the resonant shells 60 of constant $B_Z$ with the lowest and highest magnetic field value in the spectra where the spectrum peaks occur. The spin sites between these border shells of constant $B_Z$ are probed in this method of magnetic resonance imaging.

Magnetic resonance imaging using the magnetic field from the magnetic particle 12 thus results in sharp peaks in the spectrum 38 that reveal the underlying atomic structure. As opposed to using linear magnetic field gradients in resolving the crystal planes as in certain other methods, the magnetic particle 12 provides highly non-linear magnetic field gradients. Nevertheless, as FIG. 3 shows, the shells of constant $B_Z$ intersect the crystal 16 in a way that allows one to resolve and reveal the underlying atomic lattice planes in the magnetic resonance signal. For the exemplary case shown in FIG. 3, the shells of constant $B_Z$ intersect the <100> planes of the crystal 16 to give the spectral peaks. This intersection of the shells of constant $B_Z$ from the magnetic particle 12 through the crystal lattice draws an analogy to the Ewald construction in crystallography. However, in magnetic resonance imaging using the magnetic particle 12, the intersection of the shells of constant $B_Z$ occurs in the real space lattice, while the Ewald construction is carried out in the reciprocal lattice space.

Figure 4A:
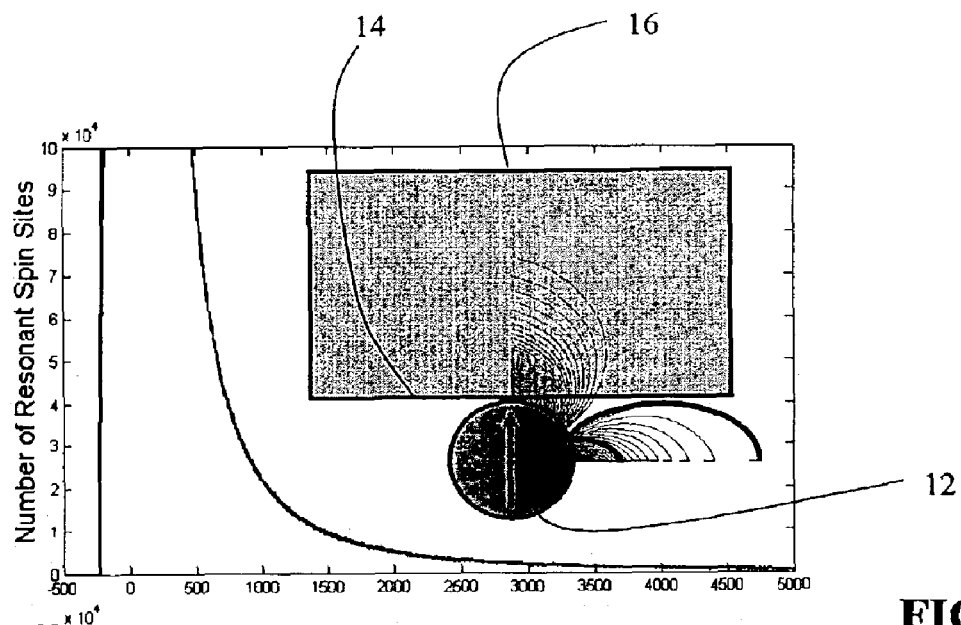
FIGS. 4A–4C shows magnetic resonance spectra for three different angle configurations, respectively, of a sample with respect to a magnetic moment of a magnetic particle, with insets modeling the relative positions of the sample and magnetic particle.

Reasons for the appearance of magnetic resonance peaks of FIG. 2 in the configuration of FIG. 1 also reveal why such peaks were not predicted or observed in, for example, conventional MRFM investigations. The samples 16 in conventional MRFM work are normally positioned so that the magnetic moment m of the magnetic particle 12 is perpendicular to the sample surface 14. This conventional configuration is shown in the inset of FIG. 4A. This choice of experimental conditions is made conventionally because the magnetic field gradient along the z-axis in such a configuration is twice as large as the gradient along the x-axis in the configuration of FIG. 1. However, by considering the intersections of shells of constant $B_Z$ and the crystal lattice that result in the sharp spectral peaks, as shown in the inset of FIG. 2A, one realizes that none of the shells can intersect the crystal 16 in a way that would resolve and reveal the underlying atomic lattice planes. The graph shown in FIG. 4A, for example, shows the simulation for the configuration shown in the inset of FIG. 4A, where no clear, or sharp, signatures of the atomic lattices are present.

Figure 4B:
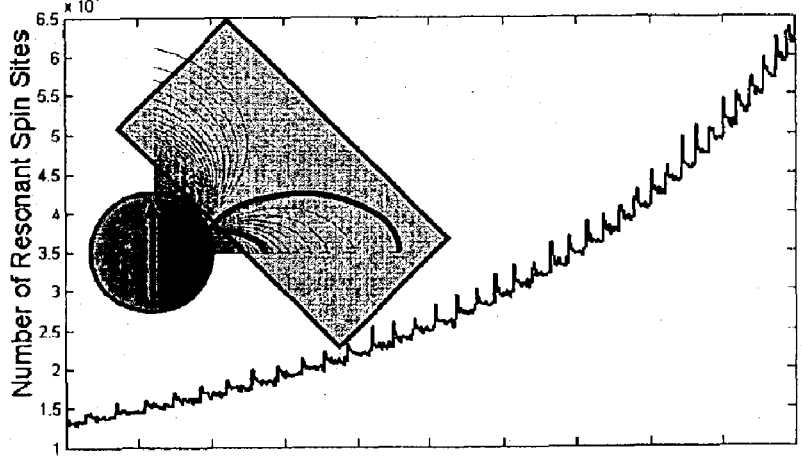
Figure 4C:
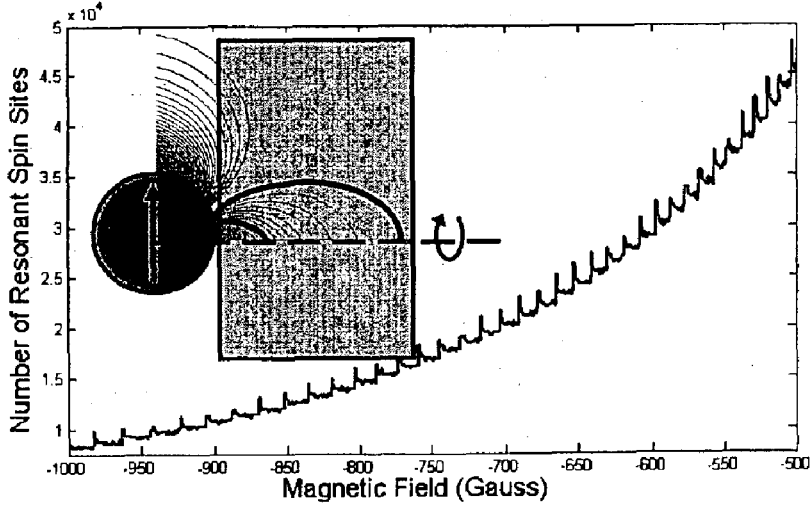

Although the peaks 40 are not evident for a crystal rotated at a 90 degree angle around the y-axis, as shown in FIG. 4A, much like in other crystallographic methods, the spectral peaks are expected at other angles where the thin azimuthally symmetric resonant shells of constant $B_Z$ properly intersect the crystal lattice planes of the sample 16. In the azimuthally symmetric system of FIG. 1 there is no dependence of the spectra for crystal rotation around the z-axis. However, there is an angular dependence of the spectra on the rotation of the crystal 16 around the x-axis by the angle φ, as well as on the rotation of the crystal with respect to the y-axis by the angle θ. Two separate examples are given for the rotation of the crystal 16: by 45 degrees around the y-axis in FIG. 4B; and by the same angle around the x-axis in FIG. 4C. As expected, the magnetic resonance spectral peaks 40 appear since the shells of constant $B_z$ properly intersect the atomic lattice planes of the crystal 16 at appropriate magnetic field values. Drawing on analogy with other crystallographic techniques, the shells of constant $B_z$ intersect the <110> and <101> planes of the crystal for the two cases shown in FIGS. 4B and 4C. The angular resolution of the sharpness of the spectral peaks 40 was also computed, and the linewidth of the angular resolution was found to be approximately Δ=0.5 degrees for the y-axis of rotation, and Δ=0.2 degrees for the x-axis of rotation.

Figure 5:
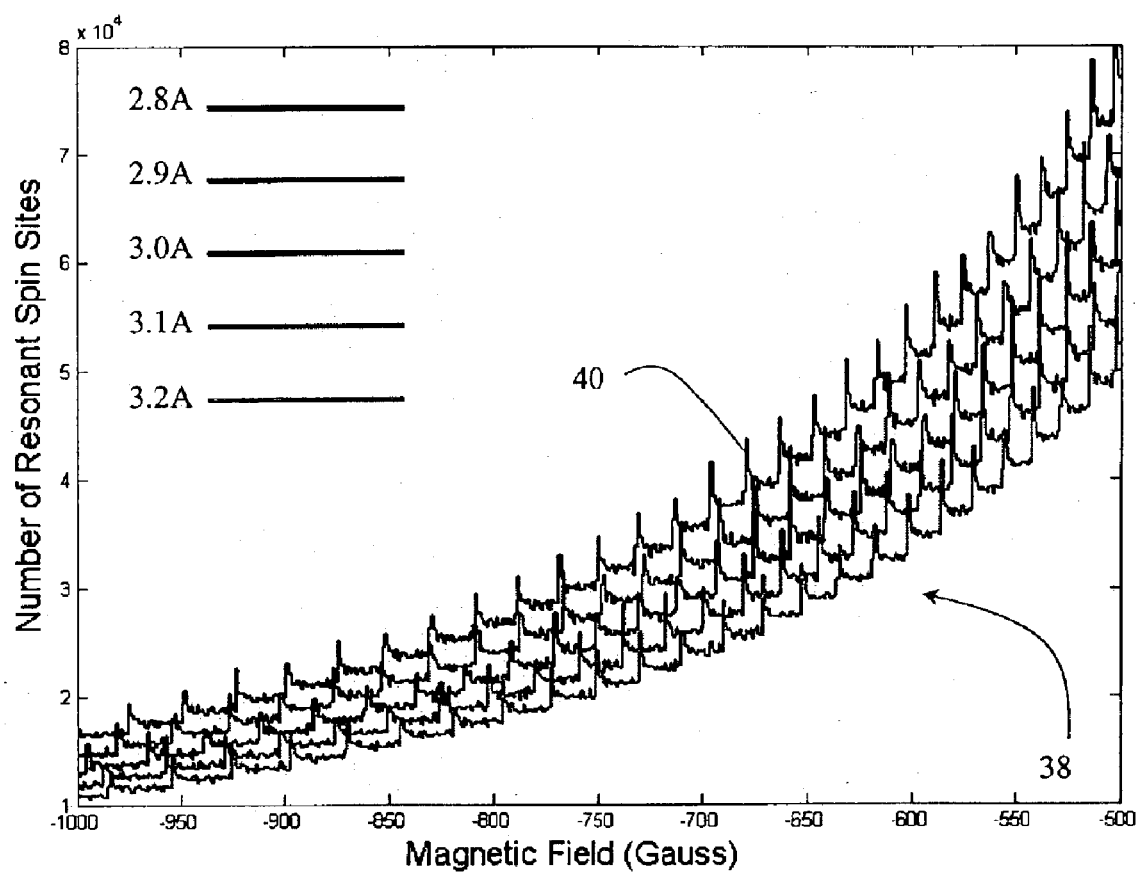
FIG. 5 shows magnetic resonance spectra from a simple cubic crystal with different unit cell dimensions.

The dependence of the spectral peaks 40 on the crystal lattice dimensions of the sample 16 and the magnetic particle 12 size and magnetization was also investigated. The spectra 38 for the five simple cubic crystal lattices with the unit cell size ranging from $a_0$=2.8 Angstroms to $a_0$=3.2 Angstroms is shown in FIG. 5. There is a distinguishable difference among the five spectra 38 shown, with clearly different frequencies of the magnetic resonance peaks 40. This feature is significant for potential crystallography applications, for example, since the different frequencies resulting from the method provide a measurement scale for distinguishing different crystal lattice dimensions.

Figure 6A:
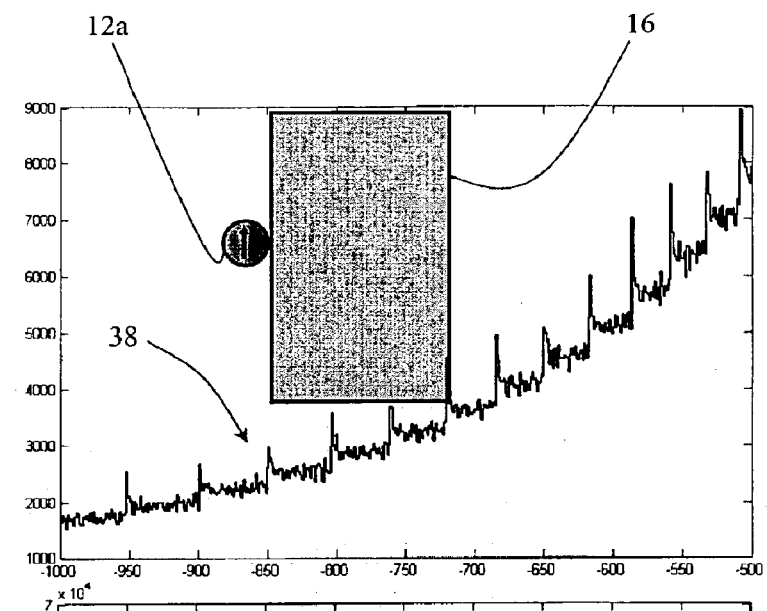
FIGS. 6A–6C show magnetic resonance spectra from a simple cubic crystal and Cobalt sphere dimensions of 50 nm, 100 nm, and 200 nm, respectively.
Figure 6B:
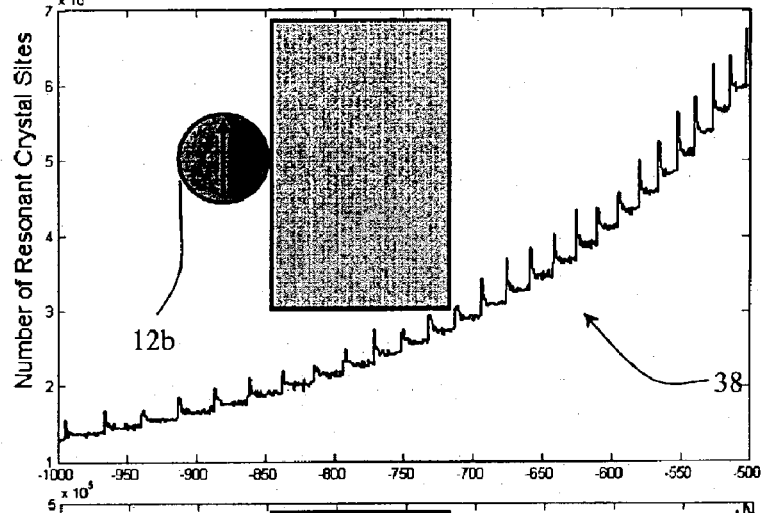
Figure 6C:
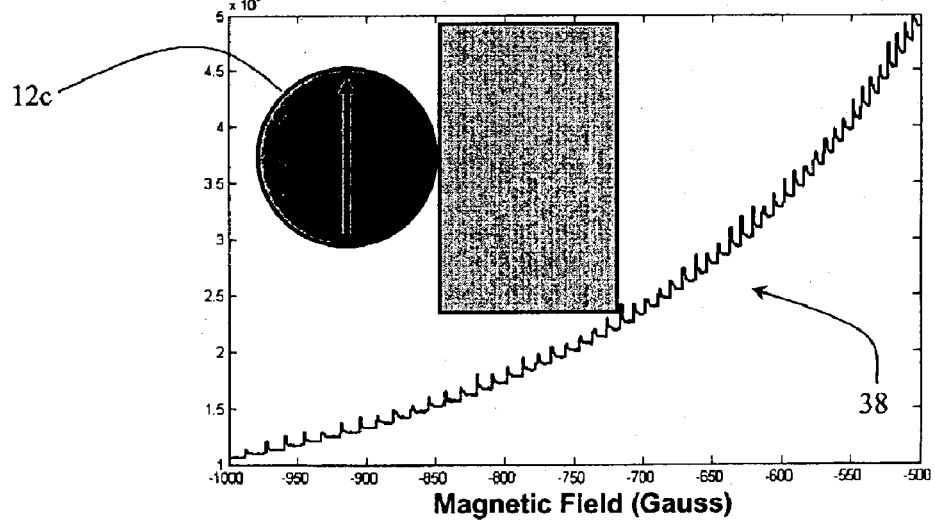

As shown in FIGS. 6A–6C, the variation in the size of the magnetic particle 12 (for the tests in FIGS. 6A–6C, a sphere) also results in noticeable differences in the observed magnetic resonance spectra 38. FIGS. 6A, 6B, and 6C shows the spectra 38 for three different Cobalt spheres 12a, 12b, 12c with diameters of 50 nm, 100 nm, and 200 nm, respectively. Observation of the spectra 38 reveals that the frequency of the magnetic resonance spectral peaks 40 is proportional to the diameter of the magnetic particle 12, as is the number of resonant spins in each spectral peak 40. This suggests an important trade-off, with smaller particles providing higher spectral (spatial) resolution, but with the requirement of higher sensitivity due to the smaller number of spins that needs to be detected. Larger magnetic particles provide lower spectral (spatial) resolution, but allow less stringent sensitivity requirements due to the higher number of spins that needs to be detected in each spectral peak 40. Simulations of the effect of sphere moment m also reveal that higher moment materials for the particles 12 provide more numerous and sharper peaks at higher field values than lower moment particles. Therefore, Cobalt or Iron particles, for example, are preferred over lower saturation magnetization materials such as Nickel.

Further applications of the magnetic resonance imaging using, for example, particles 12 such as the magnetic spheres can be pursued with a closer analysis of the resonant spin sites within a thin shell of constant magnetic field $B_z$, as shown in FIG. 3. It is apparent that the sharp spectral peaks 40 come from the very narrow regions of the sample 16, while there is a large background signal from other resonant spin sites that are intersected by the 1-Gauss thick shell of constant $B_z$. This feature of magnetic resonance imaging can be exploited in the studies of crystalline samples that are different from the semi-infinite crystal sample 16 of FIG. 1.

Figure 7:
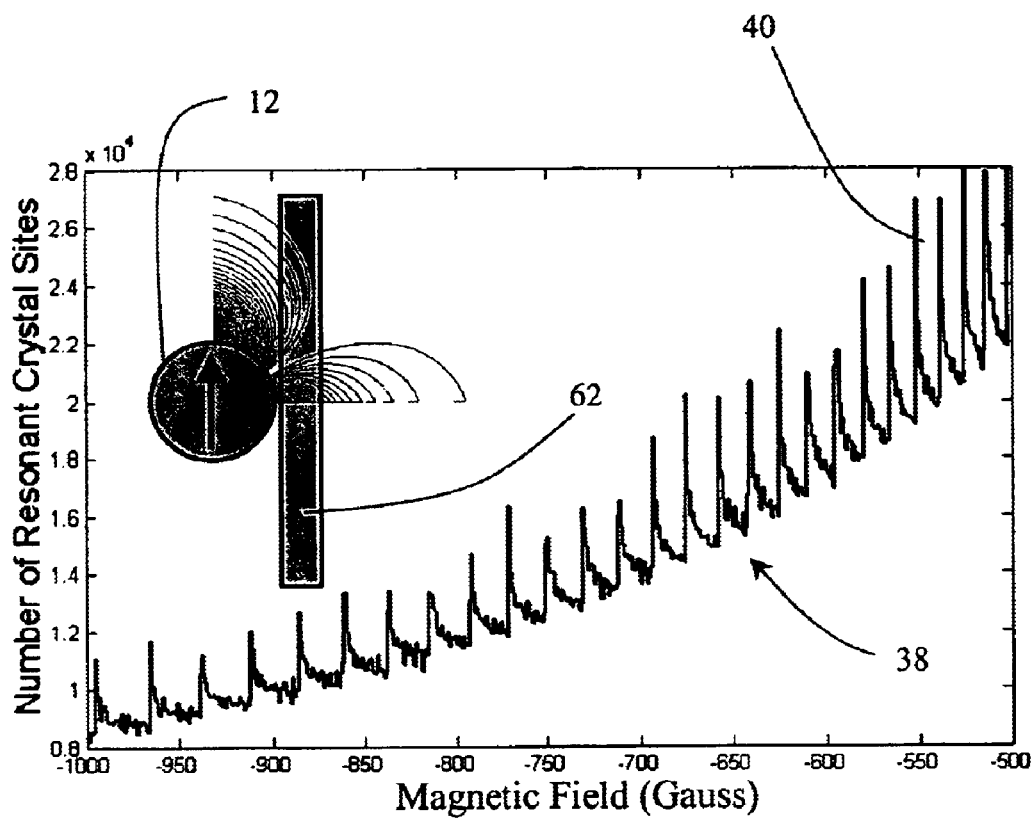
FIG. 7 shows magnetic resonance spectra from a thin simple crystal film.

Referring now to FIG. 7, a simple cubic crystalline film 60 is shown in the inset, with a thickness of 100 unit cells in the x-direction but infinite in the y and z directions. The spectrum 38 expected from such a structure is shown in the graph of FIG. 7. The resonant peaks 40 occur at the same location as for the semi-infinite crystal sample 16 shown in FIG. 1, but they lack the large background signal because there are no atoms intersected by the resonant magnetic field shell beyond the 100th unit cell. This reduction in the large background signal would most certainly be advantageous in experimental work, and would qualify this magnetic resonance imaging technique for use in thin film studies. The same conclusions from the semi-infinite crystal sample 16 regarding the angular resolution and dependence of spectral peaks on the crystal unit cell size apply for the thin film crystal 60.

In addition to the thin film crystalline structures 60, the fact that only narrow sections of the sample 16 contribute to the peaks 40 in the magnetic resonance spectra could be applied to the studies of samples in the form of small crystallites. FIG. 8 shows a simulation of a 100×100×100 atoms cubic lattice crystallite 70 scanned by the 100 nm diameter Cobalt magnetic sphere 12b. As the magnetic sphere 12b is scanned over the cubic lattice crystallite 70 in 12 nm increments, the spectrum 38 shows sharp resonant peaks 40 in the narrow scan range of approximately 50 nm where the atomic lattice planes of the crystallite pass through the resonant slices of constant $B_z$. A sequence of spectra 38 shows, as in the case of the thin film sample 60, that the large background signal is almost non-existent in the magnetic resonance spectra. Therefore, even small crystallites would provide sharp peaks 40 in magnetic resonance spectra 38 with many spins in the atomic lattice planes coherently contributing to the signal.

As previously described, the new magnetic resonance imaging method disclosed provides an opportunity to detect the presence of atomic lattice planes by detecting the numerous spins that are coherently in resonance at the same value of the magnetic field. As a result, the preferred method potentially significantly relaxes the experimental constraints on the measurement from the single spin detection proposals of MRFM, for example, since a larger detected signal is available from additional spins. The present method also potentially alleviates potential single spin detection complications. Furthermore, the size of the magnetic particle 12 that would provide sufficient spectral resolution can be, for example, an order of magnitude larger than that believed to be necessary for single spin detection, further easing experimental realization of the technique. The number of spins that have to be detected in magnetic resonance imaging using the magnetic particle 12 may, for example, range between $10^4$ and $10^5$, and the number of spins in a spectral peak 40 above the background level is on the order of $10^3$, as shown in FIG. 2. With the current sub-attonewton force detection capability using an ultra-thin cantilever and sensitive fiber optic interferometer, as well as the availability of the ultra-high magnetic field gradient sources, the detection of magnetic resonance imaging of spins using, for example, the magnetic particle 12 mounted on a mechanical cantilever is enabled. Although Cobalt is one preferred material, other materials with similar saturation magnetization but higher anisotropy such as, but not limited to, rare earth alloy PrFeB may be used, for example, to reduce thermal fluctuations.

Additionally, although the exemplary methods described herein may use a method similar to MRFM for the realization of magnetic resonance imaging, many other detection systems may be potentially used as well. These detection techniques may include, for example, micro-coil NMR, micro-SQUID detectors, Hall sensors, superconducting resonators, and microwave waveguides. These variations provide additional routes to the proposed atomic resolution magnetic resonance imaging.

Additionally, there are many other potential variations relating to the concept of magnetic resonance imaging using the magnetic field from the magnetic sphere 12, including examining the magnetic resonance spectra 38 from crystal structures of samples 16 other than the simple cubic lattice described herein, and other potential experimental techniques for the sensitive detection of the magnetic resonance signal. Still further, although the methods disclosed herein has been described by example in the context of imaging and crystallographic applications, certain parallels between this imaging technique and other scientific topics where the interaction of the microscopic magnetic objects and discrete spins of the crystal lattice suggest other possible contexts, for example quantum computation.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the invention are set forth in the appended claims.

What is claimed is:

1. A method of imaging a sample, the method comprising the steps of:
    positioning a magnetic particle near a surface of the sample;
    applying a strong direct current (DC) magnetic field in a first, non-perpendicular direction relative to the surface of the sample;
    applying a RF field in a second direction to produce magnetic resonance of a plurality of magnetic spins of the sample in a region near the magnetic particle;
    detecting the magnetic resonance of the plurality of magnetic spins to produce a magnetic resonance signal;
    wherein the magnetic resonance signal includes a spectrum having one or more spectral peaks;
    wherein the one or more spectral peaks represent a lattice plane of the sample.

2. The method of claim 1 wherein said step of applying at least one strong direct current (DC) magnetic field comprises at least one of sweeping a strong direct current (DC) magnetic field wherein a frequency of the RF field is held constant, and sweeping the RF frequency wherein the DC magnetic field is held constant.

3. The method of claim 1 wherein the second direction is perpendicular to the first direction.

4. The method of claim 1 wherein the one or more spectral peaks provide a direct signature of the lattice plane.

5. The method of claim 4 wherein the spectrum comprises a plurality of spin counts.

6. The method of claim 5 wherein each of the spin counts is for a different RF magnetic field frequency.

7. The method of claim 5 wherein each of the spin counts is for a different strong direct current (DC) magnetic field strength.

8. The method of claim 1 wherein the spectral peaks represent the lattice plane of the sample with atomic resolution.

9. The method of claim 1 wherein said step of positioning comprises supporting the magnetic particle on a positioner and moving the positioner so that the magnetic particle is positioned near the sample.

10. The method of claim 9 wherein the magnetic particle is positioned against the sample.

11. The method of claim 1 wherein the magnetic particle comprises a magnetic sphere.

12. The method of claim 1 further comprising:
    repositioning at least one of the magnetic particle and the sample in a scanning direction to a second position;
    applying a strong direct current (DC) magnetic field in a first, non-perpendicular direction relative to the surface of the sample;
    applying a RF field weaker than the strong magnetic field in a second direction to produce magnetic resonance of a second plurality of magnetic spins of the sample in a region of the magnetic particle;
    detecting the resonance of the second plurality of magnetic spins.

13. The method of claim 12 wherein the plurality of magnetic spins and the second plurality of magnetic spins are used to produce an image.

14. The method of claim 1 wherein the sample is a crystal.

15. A method of imaging a sample, comprising:
    positioning a magnetic particle near the sample;
    applying a polarizing magnetic field to polarize the sample;
    applying a RF field to cause a plurality of magnetic spins of the sample in a region to resonate near the magnetic particle;
    detecting the resonance of the plurality of magnetic spins of the sample to produce an absorption spectrum, the absorption spectrum including a plurality of peaks;
    wherein the peaks are a signature of an atomic structure of the sample.

16. A method of imaging a sample, the method comprising the steps of:
    positioning a microscopic particle near the sample;
    applying a DC magnetic field to the sample;
    applying an RF field to the sample;
    detecting resonant spins at different values of at least one of the DC magnetic field and the RF field to produce spectra;
    wherein the spectra provides a measurement scale for distinguishing crystal lattice dimensions of the sample.

17. A method of imaging a sample, the method comprising the steps of:
    positioning a magnetic particle near a surface of the sample;
    applying a strong direct current (DC) magnetic field in a first, non-perpendicular direction relative to the surface of the sample;
    applying a RF field in a second direction to produce magnetic resonance of a plurality of magnetic spins of the sample in a region near the magnetic particle;
    detecting the magnetic resonance of the plurality of magnetic spins;
    repositioning at least one of the magnetic particle and the sample in a scanning direction to a second position;
    applying a strong direct current (DC) magnetic field in a first, non-perpendicular direction relative to the surface of the sample;
    applying a RF field weaker than the strong magnetic field in a second direction to produce magnetic resonance of a second plurality of magnetic spins of the sample in a region of the magnetic particle;
    detecting the resonance of the second plurality of magnetic spins.

18. The method of claim 17 wherein the plurality of magnetic spins and the second plurality of magnetic spins are used to produce an image.

* * * * *

UNITED STATES PATENT AND TRADEMARK OFFICE
CERTIFICATE OF CORRECTION

PATENT NO.    : 6,897,654 B2
DATED         : May 24, 2005
INVENTOR(S)   : Mladin Barbic It is certified that error appears in the above-identified patent and that said Letters Patent is hereby corrected as shown below:

Column 1,
Line 11, please replace the paragraph with the following rewritten paragraph:
-- The U.S. Government has certain rights in this invention pursuant to Grant No. 97-24535 awarded by the National Science Foundation, Grant No. F49620-00-1-0380 awarded by the Air Force, and Grant No. N00014-00-1-0632 awarded by the Office of Naval Research. --.

Column 2,
Line 42, before "direct signature," please delete "the" and insert -- a -- therefor.

Column 5,
Line 25, please delete "swept" and insert -- (swept) -- therefor.
Line 61, after "sections," please delete "44".
Line 62, between "shell" and "of," please insert -- 44 --.

Column 7,
Line 58, please delete "60" and insert -- 62 -- therefor.

Figures 8A, 8B, 8C, 8D, 8E:
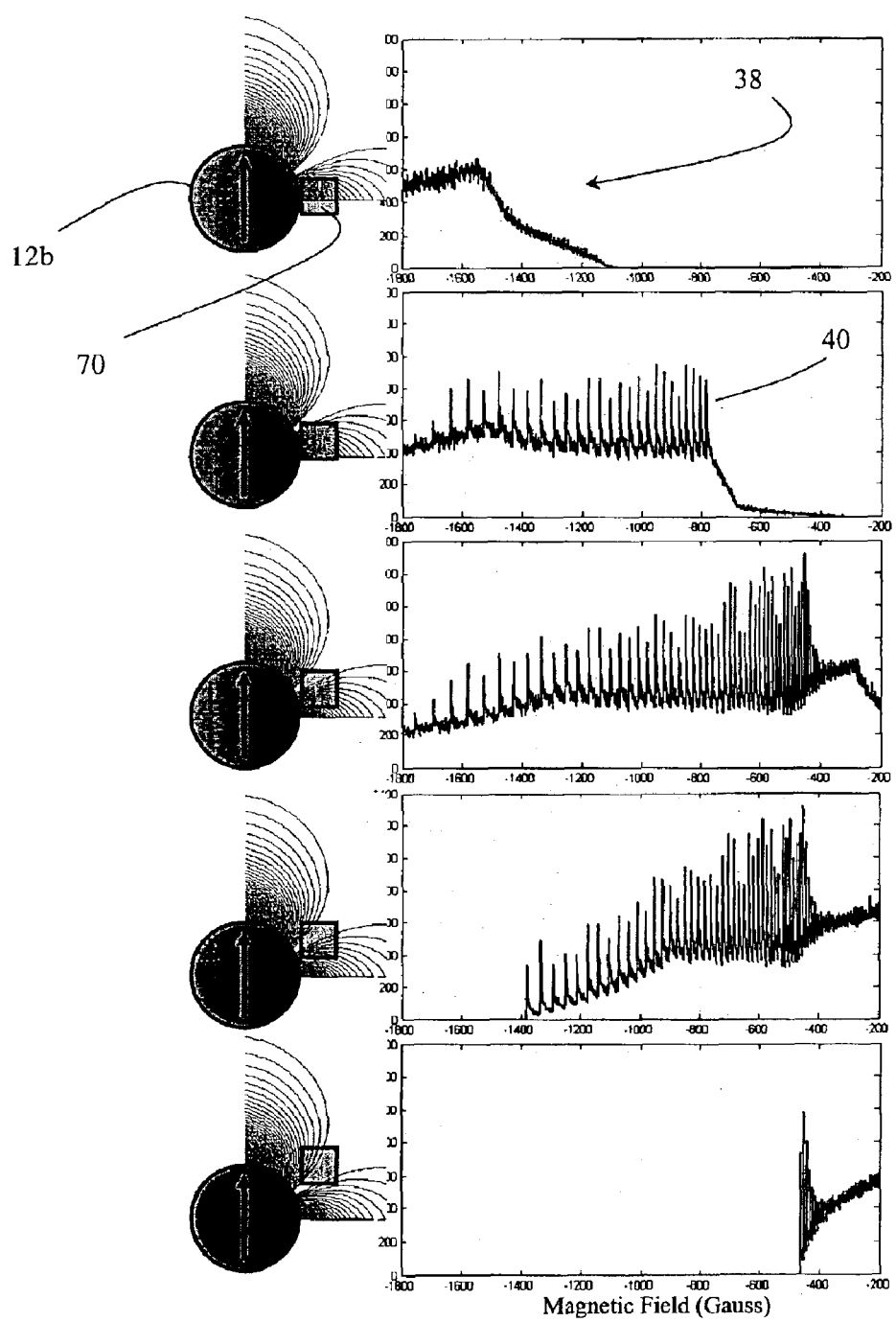
FIGS. 8A–8E show magnetic resonance spectra from a 100×100×100 atoms crystallite with a simple cubic structure and 3 Angstroms cell size, where the crystallite is scanned under a 100 nm Cobalt ferromagnetic sphere in 12 nm steps.

Column 8,
Lines 6, 7 and 18, please delete "60" and insert -- 62 -- therefor.
Line 10, before "a simulation of," please delete "FIG. 8 shows" and insert -- FIGs. 8A-8E show -- therefor.

Signed and Sealed this

Twenty-fifth Day of October, 2005

JON W. DUDAS
*Director of the United States Patent and Trademark Office*